(12) United States Patent  
Campagna et al.

(10) Patent No.: US 12,091,913 B2  
(45) Date of Patent: *Sep. 17, 2024

(54) MOTORIZED SHADE WITH CAPACITIVE TOUCH FABRIC

(71) Applicant: Crestron Electronics, Inc., Rockleigh, NJ (US)

(72) Inventors: Michael Campagna, Woodcliff Lake, NJ (US); Charles R. Derk, Jr., Park Ridge, NJ (US); Benjamin Slivka, Hillsdale, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/103,154

(22) Filed: Jan. 30, 2023

(65) Prior Publication Data

US 2023/0167679 A1 Jun. 1, 2023

Related U.S. Application Data

(63) Continuation of application No. 16/672,028, filed on Nov. 1, 2019, now Pat. No. 11,591,850.

(51) Int. Cl.
*E06B 9/68* (2006.01)
*E06B 9/322* (2006.01)
*E06B 9/70* (2006.01)
*H03K 17/96* (2006.01)

(52) U.S. Cl.
CPC .............. *E06B 9/70* (2013.01); *E06B 9/322* (2013.01); *H03K 17/962* (2013.01); *E06B 2009/3227* (2013.01); *E06B 2009/6818* (2013.01)

(58) Field of Classification Search
CPC .............. E06B 2009/3227; E06B 9/70; E06B 2009/6818; E06B 9/322; E06B 9/68; H03K 17/962
See application file for complete search history.

(56) References Cited

U.S. PATENT DOCUMENTS

| | | | |
|---|---|---|---|
| 9,644,424 B2* | 5/2017 | Slivka | E06B 9/72 |
| 2017/0370030 A1* | 12/2017 | Podhajny | G06F 3/0446 |
| 2018/0202224 A1* | 7/2018 | Kumar | E06B 9/42 |
| 2019/0150651 A1* | 5/2019 | Pham | H02P 1/16 |
| 2019/0277087 A1* | 9/2019 | Pereira | E06B 9/322 |
| 2021/0124443 A1* | 4/2021 | Wu | G06N 20/00 |

* cited by examiner

*Primary Examiner* — Daniel P Cahn  
*Assistant Examiner* — Jeremy C Ramsey  
(74) *Attorney, Agent, or Firm* — Crestron Electronics, Inc.

(57) ABSTRACT

A motorized shade for covering an architectural opening comprising a roller tube and a shade material comprising an upper end attached to the roller tube and a lower end. The shade material at least partially comprises electrically conductive material and the roller tube comprises an electrically conductive material that creates an electrically conductive path between the conductive material of the shade material and the roller tube. The motorized shade further comprises a capacitive touch sensor electrically connected to the roller tube via at least one electrical contact, and a controller electrically connected to the capacitive touch sensor and adapted to detect a touch of the shade material via the capacitive touch sensor and in response generate a command.

20 Claims, 5 Drawing Sheets

700

| Shade_position | Operating_command |
|---|---|
| 704 — Lower_limit | Raise |
| 706 — During_raise | Stop |
| 708 — Partially_drawn_≤T_after_raise_stop | Lower |
| 710 — Upper_limit | Lower |
| 712 — During_lower | Stop |
| 714 — Partially_drawn_≤T_after_lower_stop | Raise |
| 716 — Partially_drawn_>T | Raise |

701 — Shade_position column
702 — Operating_command column

| Gesture | Shade_position | Operating_command |
|---|---|---|
| 804 — Single_touch | Stationary_NOT_Lower_Limit | Lower |
| 806 — Double_touch | Stationary_NOT_Upper_Limit | Raise |
| 808 — Single_touch | Moving | Stop |
| 810 — Double_touch | Moving | Stop |
| 812 — Hold | Stationary_NOT_Lower_Limit | Slow_lower |
| 814 — Release_hold | Moving | Stop |
| 816 — Tap_hold | Stationary_NOT_Upper_Limit | Slow_raise |
| 818 — Release_tap_hold | Moving | Stop |
| 819 — Hold | Moving | Stop |
| 820 — Tap_hold | Moving | Stop |

801 — Gesture
802 — Shade_position
803 — Operating_command

FIG. 8

MOTORIZED SHADE WITH CAPACITIVE TOUCH FABRIC

BACKGROUND OF THE INVENTION

Technical Field

Aspects of the embodiments relate to motorized shades, and more particularly to systems, methods, and modes for a motorized roller shade that can be controlled via a capacitive touch fabric or shade material.

Background Art

Motorized roller shades provide a convenient one-touch control solution for screening windows, doors, or the like, to achieve privacy and thermal effects. A motorized roller shade typically includes a rectangular shade material attached at one end to a cylindrical rotating tube, called a roller tube, and at an opposite end to a hem bar. The shade material is wrapped around the roller tube. An electric motor, either mounted inside the roller tube or externally coupled to the roller tube, rotates the roller tube to unravel the shade material to cover a window.

Motorized roller shades can be controlled in a variety of means, including via in-wall switches or keypads or remotely via handheld remotes. Often, however, users prefer a local control of a motorized shade, without requiring connection to a control system or additional control products. Some motorized roller shades allow local control via buttons on the shade controller coupled to the roller shade motor in proximity to the roller tube. However, these buttons may be difficult or impossible to reach and they are non-intuitive. Another solution exists that utilizes sensors which sense a pull or a tug on the shade material or a hem bar to actuate the roller shade to control it locally. However, this solution requires quite a bit of force to pull on the shade material or the hem bar and it is slow to react. Additionally, continued pulling on a shade material for control can misalign the shade material, damage the shade material, or loosen tension in a counterbalancing system of the roller shade, in particularly when the roller shade is mounted poorly.

Accordingly, a need has arisen for a local control of a motorized shade, and more specifically, for a touch actuated motorized roller shade.

SUMMARY OF THE INVENTION

It is an object of the embodiments to substantially solve at least the problems and/or disadvantages discussed above, and to provide at least one or more of the advantages described below.

It is therefore a general aspect of the embodiments to provide systems, methods, and modes for a local control of a motorized shade that will obviate or minimize problems of the type previously described.

It is also an aspect of the embodiments to provide systems, methods, and modes for a touch actuated motorized roller shade, and more particularly for a motorized roller shade that can be controlled via a capacitive touch fabric.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

DISCLOSURE OF INVENTION

According to one aspects of the embodiments, a motorized shade is provided for covering an architectural opening. The motorized shade comprises a shade material comprising and extending between an upper end and a lower end, wherein the shade material at least partially comprises electrically conductive material. The motorized shade further comprises a motor drive unit operably connected to the upper end of the shade material and comprising a motor and a motor control module adapted to control the motor. The motor control module comprises a capacitive touch sensor that is electrically connected to the upper end of the shade material via at least one electrical contact. The motor control module is adapted to detect a touch of the shade material via the capacitive touch sensor and in response control the motor to raise or lower the shade material.

According to an embodiment, the shade material comprises at least one thread comprising the electrically conductive material. The conductive thread may comprise a core and an outer layer. The core may comprise the electrically conductive material. The outer layer may comprise material with low or substantially no conductance. The outer layer may be infused with electrically conductive material. According to another embodiment, the shade material comprises a plurality of warp threads comprising the electrically conductive material. The plurality of conductive warp threads may be intermittently weaved in the shade material. Each of the plurality of conductive warp threads may extend vertically along substantially the entire length of the shade material.

According to an embodiment, the motorized shade further comprises a roller tube, wherein the upper end of the shade material is attached to the roller tube, and wherein the motor drive unit controls the motor to rotate the roller tube to raise and lower the shade material. The roller tube may comprise an electrically conductive material, wherein the roller tube creates an electrically conductive path between the conductive material of the shade material and the roller tube. The roller tube may comprise a channel adapted to retain the upper end of the shade material therein. The capacitive touch sensor may be electrically connected to the roller tube via the at least one electrical contact. According to a further embodiment, the motor drive unit comprises a ball bearing such that the roller tube rotates with respect to the motor control module, wherein the ball bearing comprises an outer race electrically connected to the roller tube, an inner race electrically connected to the motor control module, and a plurality of balls disposed between the outer race and the inner race, wherein the ball bearing creates an electrically conductive path between the roller tube and the motor control module.

According to an embodiment, the motorized shade further comprising a hem bar attached to the lower end of the shade material. According to one embodiment, the hem bar comprises an electrically conductive material, wherein the motor control module is further adapted to detect a touch of the hem bar via the capacitive touch sensor. According to another embodiment, the lower end of the shade material is at least partially wrapped about the hem bar, wherein the motor control module is further adapted to detect a touch of the hem bar via the capacitive touch sensor.

According to an embodiment, the capacitive touch sensor comprise an RC oscillator adapted to generate an output signal that oscillate at an oscillation frequency, wherein the output signal is used to charge and discharge the conductive shade material, wherein the motor control module is adapted to measure the output signal to detect output frequency values. The motor control module may determine a touch of the shade material when detecting an abrupt change in the output frequency values. According to an embodiment, the motor control module may determine a touch of the shade material when an output frequency value substantially deviates from a monitored baseline frequency. The motor control module may store a set of a plurality of oscillation frequencies each associated with a position of the shade material between an upper limit and a lower limit. According to an embodiment, during operation, the motor control module may be adapted to keep track of the position of the shade material and based on the position pick an oscillation frequency to use by the capacitive touch sensor. According to an embodiment, the motor control module may decrease the oscillation frequency as the shade material lowers and increase the oscillation frequency as the shade material is raised. According to yet another embodiment, the motor control module may be adapted to self-calibrate during operation of the roller shade to continuously update the oscillation frequency. During operation of the roller shade, the motor control module may be adapted to sweep through a plurality of different oscillation frequencies used by the capacitive touch sensor. According to another embodiment, the controller may be adapted to sweep through a plurality of predetermined output impedance values to determine the monitored baseline frequency.

According to another embodiment, the shade material comprises a plurality of warp threads each comprising the electrically conductive material, wherein the motor control module is adapted to detect a swipe up gesture upon detecting a progressive growth in the output frequency values, and wherein the motor control module is adapted to detect a swipe down gesture upon detecting a progressive decline in the output frequency values. The motor control module may be adapted to direct the motor to raise the shade material upon detecting the swipe up gesture, and wherein the motor control module is adapted to direct the motor to lower the shade material upon detecting a swipe down gesture. The electrically conductive material of each conductive warp thread may comprise a material having large resistance.

According to an embodiment, the motor control module is adapted to detect a first gesture designated to direct the motor to raise the shade material, and a second gesture designated to direct the motor to lower the shade material. The first gesture may comprise a single touch and the second gesture comprises a double touch, or vice-versa. According to an embodiment, the motor control module may stop raising or lowering the shade material when the motor control module detects a touch of the shade material while the shade material is in the process of being raised or lowered, respectively. According to a further embodiment, the motor control module may be adapted to detect a hold and release gesture designated to direct the motor to raise or lower the shade material in response to a detected hold of the shade material and to stop raising or lowering the shade material in response to a detected release of the shade material. According yet to another embodiment, the motor control module may be adapted to detect a tap-hold and release gesture designated to direct the motor to raise or lower the shade material in response to a detected tap and hold of the shade material and to stop raising or lowering the shade material in response to a detected release of the shade material.

According to another aspect of the embodiments, a motorized shade is provided for covering an architectural opening. The motorized shade comprises a shade material, a roller tube and a motor drive unit. The shade material comprises and extends between an upper end and a lower end, wherein the shade material comprises a plurality of warp threads each comprising an electrically conductive material. The roller tube comprises an electrically conductive material. The upper end of the shade material is attached to the roller tube, which creates an electrically conductive path between the conductive warp threads of the shade material and the roller tube. The motor drive unit is positioned within the roller tube and comprises a motor and a motor control module comprising a capacitive touch sensor. The capacitive touch sensor is electrically connected to the roller tube via at least one electrical contact. The motor control module is adapted to detect a touch of the shade material via the capacitive touch sensor and in response control the motor to rotate the roller tube to raise or lower the shade material.

According to yet another aspect of the embodiments, a motorized roller shade is provided for covering an architectural opening. The motorized roller shade comprises a shade material, a roller tube, and a motor drive unit. The shade material comprises and extends between an upper end and a lower end, wherein the shade material comprises a plurality of warp threads each comprising an electrically conductive material. The roller tube comprises an electrically conductive material. The upper end of the shade material is attached to the roller tube, which creates an electrically conductive path between the conductive warp threads of the shade material and the roller tube. The motor drive unit is positioned within the roller tube and comprises a motor and a motor control module adapted to control the motor. The motor control module is electrically connected to the roller tube via at least one electrical contact. The motor control module comprises an RC oscillator adapted to generate an output signal that oscillate at an oscillation frequency. The output signal is used to charge and discharge the conductive warp threads. The motor control module is adapted to measure the output signal to detect output frequency values. The motor control module is adapted to detect a swipe up gesture upon detecting a progressive growth in the output frequency values and in response direct the motor to rotate the roller tube to raise the shade material. The motor control module is adapted to detect a swipe down gesture upon detecting a progressive decline in the output frequency values and in response direct the motor to rotate the roller tube to lower the shade material. According to an embodiment, the motor drive unit may further comprise a ball bearing such that the roller tube rotates with respect to the motor control module, wherein the ball bearing comprises an outer race electrically connected to the roller tube, an inner race electrically connected to the motor control module, and a plurality of balls disposed between the outer race and the inner race, wherein the ball bearing creates an electrically conductive path between the roller tube and the motor control module.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWING

Figure 1:
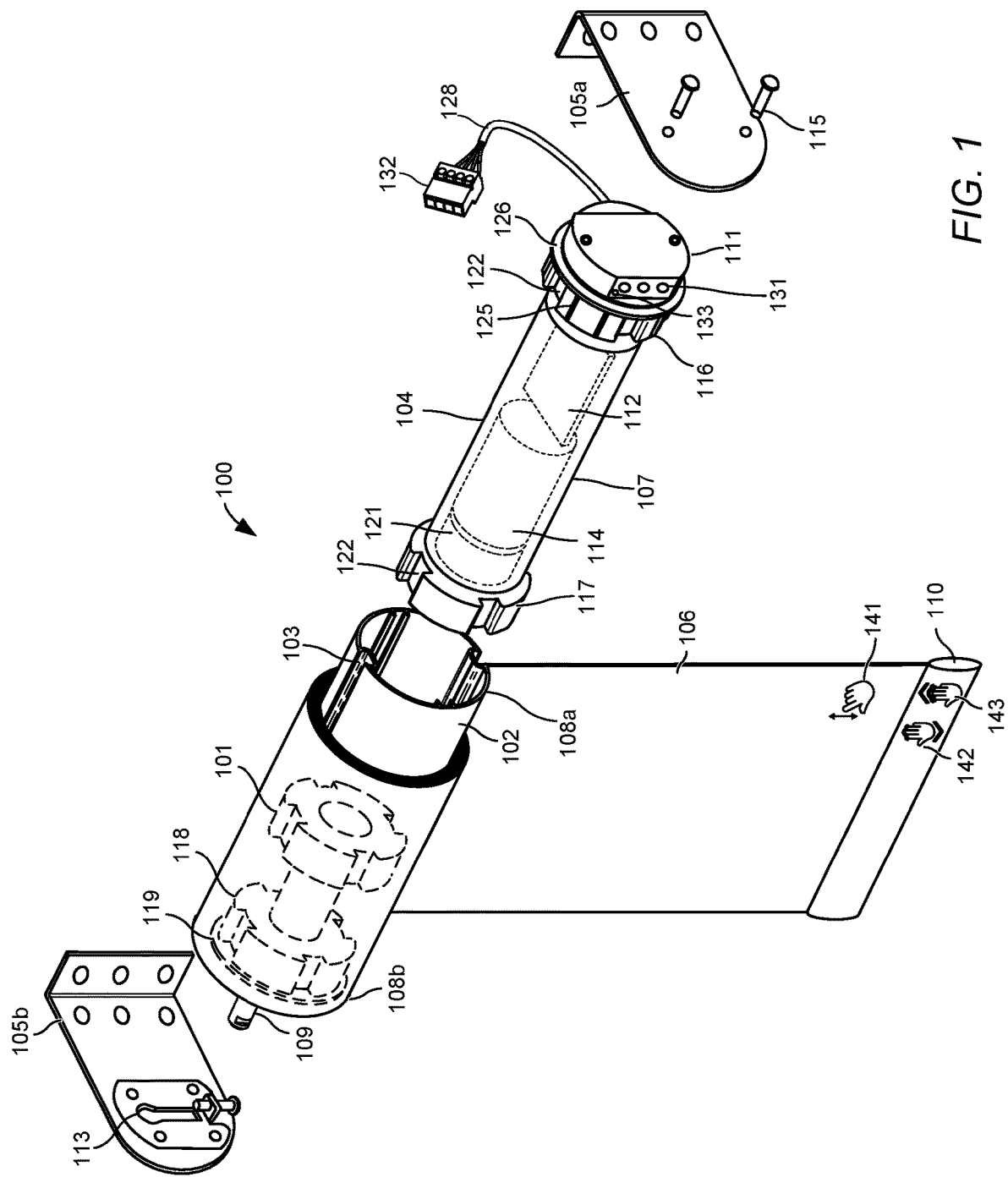

FIG. 1 illustrates a front perspective view of a roller shade according to one embodiment.

Figure 2:
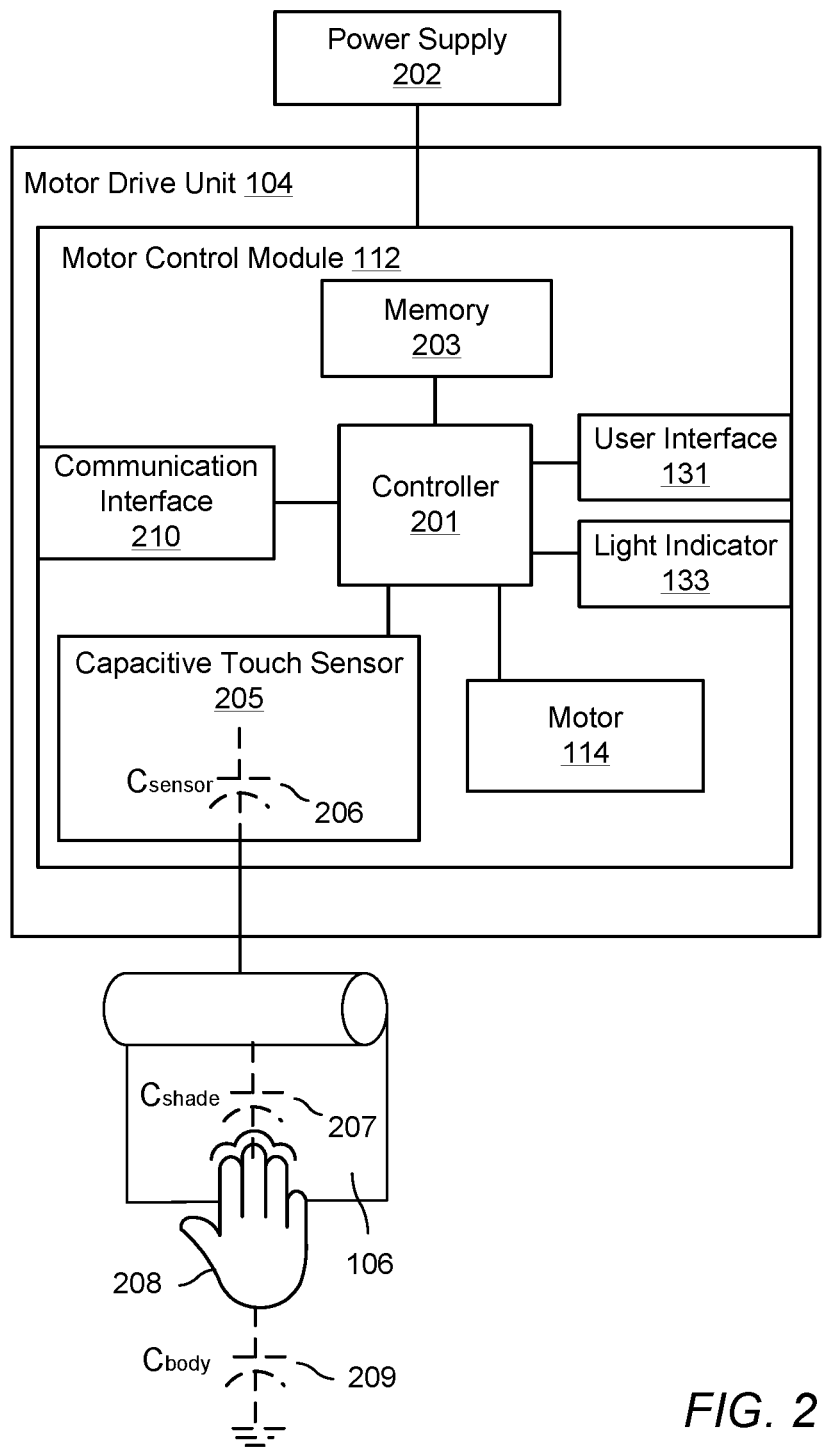

FIG. 2 illustrates a block diagram of the motor drive unit according to one embodiment.

Figure 3:
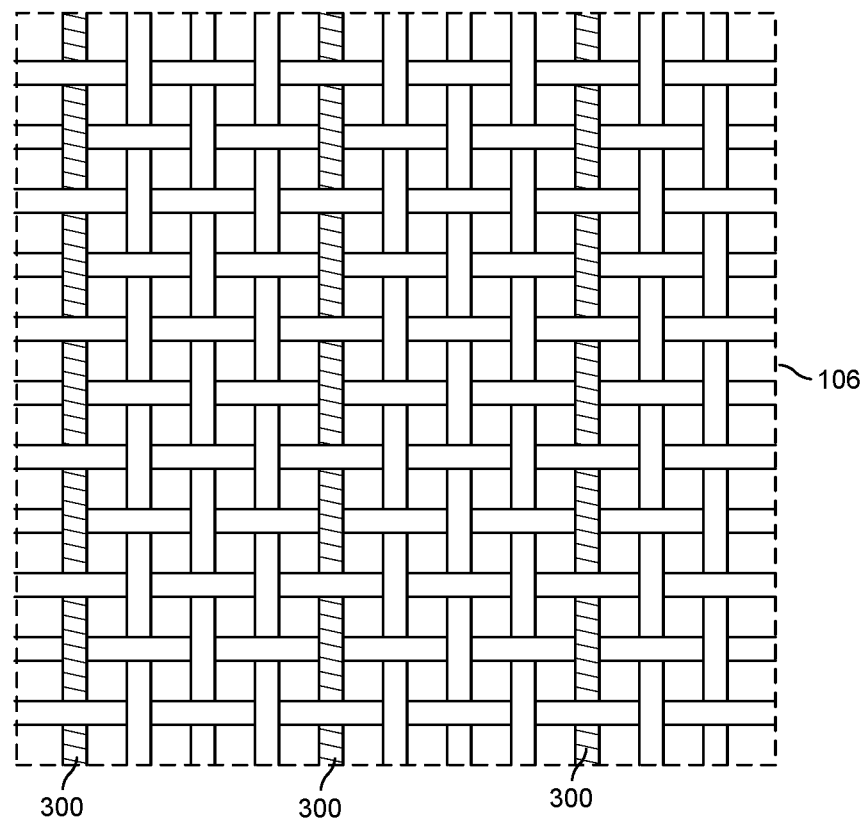

FIG. 3 illustrates an exemplary enlarged swatch of shade material according to one embodiment.

Figure 4:
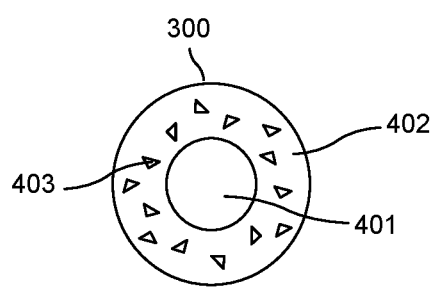

FIG. 4 illustrates a cross-sectional view of a conductive thread of the shade material according to one embodiment.

Figure 5:
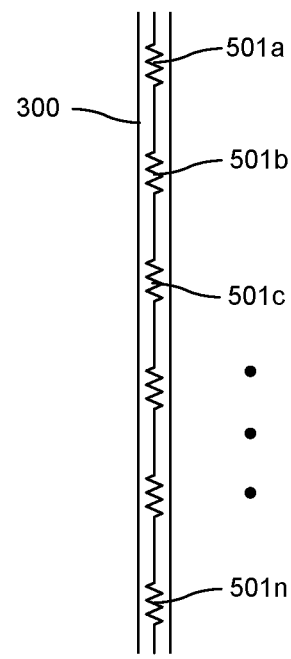

FIG. 5 illustrates a representation of the resistance of a single vertical conductive thread according to one embodiment.

Figure 6:
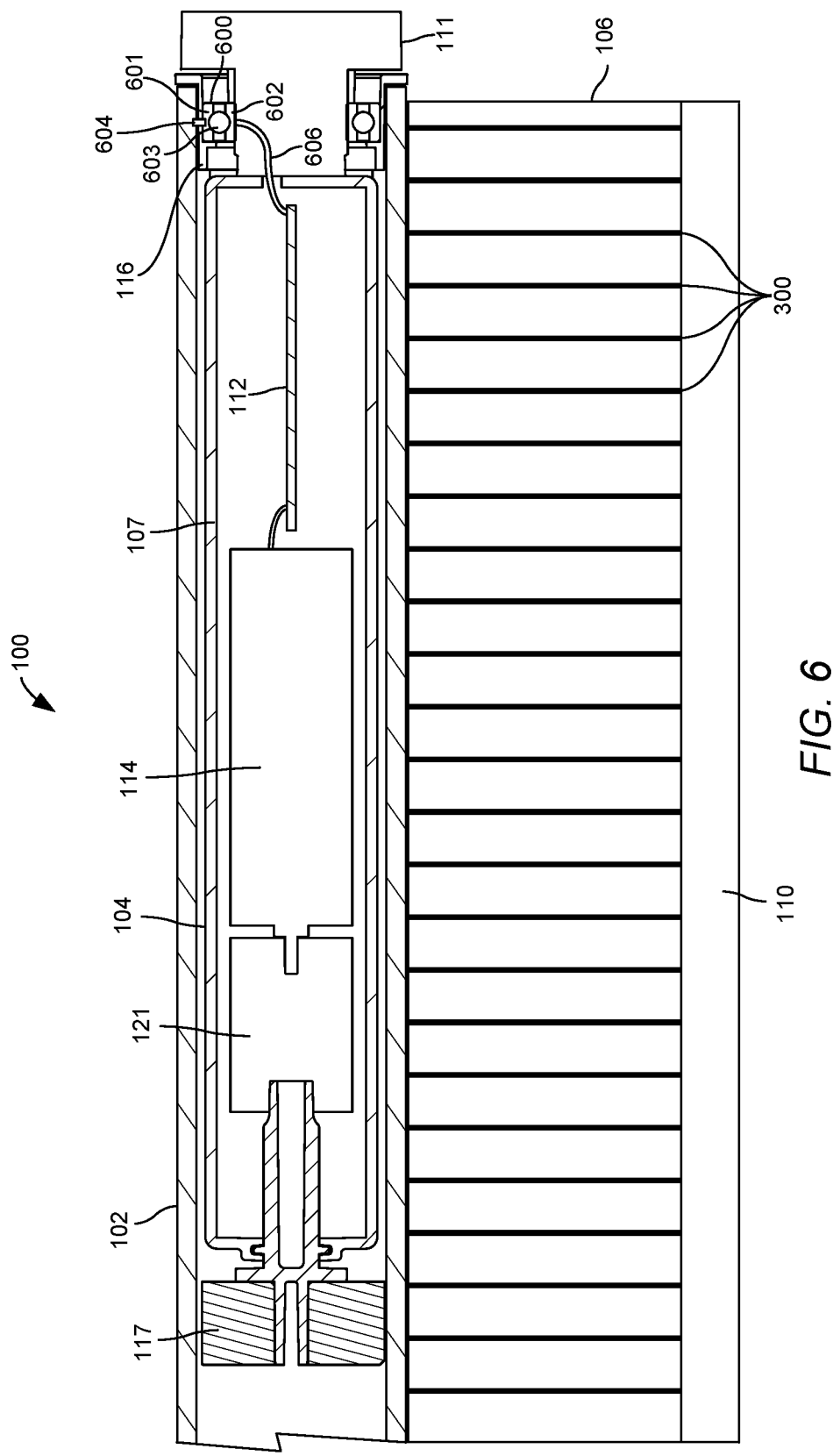

FIG. 6 illustrates a cross-sectional view of the roller shade according to one embodiment.

FIG. 7 illustrates a table including objects identifying the operating commands of the motor control module according to one embodiment.

FIG. 8 illustrates a table including objects identifying the operating commands of the motor control module according to another embodiment.

DETAILED DESCRIPTION OF THE INVENTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as roller shades.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
100 Roller Shade
101 Idler Assembly
102 Roller Tube
103 Channel
104 Motor drive Unit
105a Mounting Bracket
105b Mounting Bracket
106 Shade Material
107 Motor Housing
108a First End
108b Second End
109 Idler Pin
110 Hem Bar
111 Motor Head
112 Motor Control Module
113 Keyhole
114 Motor
115 Screws
116 Crown Adapter Wheel
117 Drive Wheel
118 Idler Body
119 Flange
121 Clutch
122 Channels
125 Teeth
126 Flange
128 Power Cord
131 Three-Button Interface
132 Terminal Block
133 Light Indicator
141 Swipe Gesture
142 Single Touch Gesture
143 Double Touch Gesture
200 Block Diagram
201 Controller
202 Power Supply
203 Memory
205 Capacitive Touch Sensor
206 Sensor Capacitance ($C_{sensor}$)
207 Shade Material Capacitance ($C_{shade}$)
208 User
209 Body Capacitance ($C_{body}$)
210 Communication Interface
300 Electrically Conductive Thread
401 Core
402 Outer Layer
403 Conductive Material
501a-n Resistors/Resistance
600 Ball Bearing
601 Outer Race
602 Inner Race
603 Balls
604 Electrical Contact
606 Electrical Contact
700 Table
701-716 Objects
800 Table
801-820 Objects List of Acronyms Used in the Specification in Alphabetical Order The following is a list of the acronyms used in the specification in alphabetical order.

ASIC Application Specific Integrated Circuit
CAT5 Category 5 Cable
$C_{body}$ Body Capacitance
$C_{sensor}$ Sensor Capacitance
$C_{shade}$ Shade Material Capacitance
IR Infrared
kΩ Kiloohm
LAN Local Area Network
LED Light Emitting Diode
PCB Printed Circuit Board
PoE Power over Ethernet
PVC Polyvinyl Chloride
RAM Random-Access Memory
RF Radio Frequency
ROM Read-Only Memory

MODE(S) FOR CARRYING OUT THE INVENTION

For 40 years Crestron Electronics, Inc. has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein can be manufactured by Crestron Electronics, Inc., located in Rockleigh, NJ.

The different aspects of the embodiments described herein pertain to the context of motorized shades, but is not limited thereto, except as may be set forth expressly in the appended claims. While a motorized shade is described herein for covering a window, the motorized shade may be used to cover any architectural opening, such as doors, wall openings, or the like. Additionally, while the embodiments described herein reference roller shades, the embodiments described herein may be adapted in other types of window, door, or wall opening coverings, such as inverted rollers, Roman shades, Austrian shades, pleated shades, blinds, shutters, skylight shades, garage doors, or the like.

Disclosed herein are systems, methods, and modes for a local control of a motorized roller shade, more particularly a touch actuated roller shade, and more particularly a motorized roller shade that can be controlled via a capacitive touch fabric or shade material. According to some aspects of the embodiments, the user can touch any portion of the shade material surface to cause the shade material of the roller shade to automatically roll up, roll down, or stop rolling.

Referring to FIG. 1, there is shown a front perspective view of a roller shade 100 according to one aspect of the embodiments. Roller shade 100 generally comprises a roller tube 102, a motor drive unit 104, an idler assembly 101, shade material 106, and a hem bar 110. Shade material 106 is connected at its top end to the roller tube 102 and at its bottom end to the hem bar 110. Hem bar 110 can comprise a weighted bar that runs longitudinally and laterally across the width of the shade material 106 to minimizes any movement in the field and properly tensions the shade material 106 to allow for a straight hang of the shade material 106. Shade material 106 wraps around the roller tube 102 and is unraveled from the roller tube 102 to cover a window, a door, a wall opening, or the like.

Roller tube 102 is generally cylindrical in shape and longitudinally and laterally extends from a first end 108a to a second end 108b. In various embodiments, the roller tube 102 comprises electrically conductive material such as aluminum, stainless steel, or other electrically conductive materials known to those skilled in the art. The first end 108a of the roller tube 102 receives the motor drive unit 104 and the second end 108b of the roller tube 102 receives the idler assembly 101.

The idler assembly 101 of the roller shade 100 may comprise an idler pin 109 and an idler body 118 rotatably connected about the idler pin 109. The idler body 118 is inserted into and operably connected to the roller tube 102 such that rotation of the roller tube 102 also rotates the idler body 118. The idler body 118 may comprise a flange 119 to prevent the idler body 118 from sliding entirely into the roller tube 102. The idler body 118 may comprise ball bearings therein (not shown) allowing the idler body 118, and thereby the roller tube 102, rotate with respect to the idler pin 109.

The motor drive unit 104 may comprise a motor head 111, a crown adapter wheel 116, a motor housing 107 containing a motor control module 112 and a motor 114 therein, and a drive wheel 117. The motor drive unit 104 may be inserted into first end 108a of the roller tube 102. The crown adapter wheel 116 and the drive wheel 117 are generally cylindrical in shape and are inserted into and operably connected to roller tube 102 through its first end 108a. Crown adapter wheel 116 and drive wheel 117 may comprise a plurality of channels 122 extending circumferentially about their external surfaces that mate with complementary projections radially extending from the inner surface of the roller tube 102 to lock their respective rotation. Crown adapter wheel 116 can further comprise a plurality of teeth 125 extending circumferentially about its external surface to form a friction fit between the crown adapter wheel 116 and the inner surface of the roller tube 102. The crown adapter wheel 116 may be rotatably attached to a first end of the motor housing 107 via a ball bearing 600 therein (FIG. 6). Crown adapter wheel 116 can further comprise a flange 126 radially extending therefrom to prevent it from sliding entirely into the roller tube 102 and such that the motor head 111 remains at least partially exterior to the roller tube 102. The drive wheel 117 is operably connected, either directly or indirectly such as through a clutch 121 and/or gears, to the output shaft of the motor 114, such that rotation of the motor output shaft also rotates the drive wheel 117.

During installation, the roller shade 100 is mounted on or in a window between the first and second mounting brackets 105a and 105b. The roller shade 100 may first be mounted to the second mounting bracket 105b by inserting the tip of the idler pin 109 into a keyhole 113 of the second mounting bracket 105b. The roller shade 100 may then be mounted to the first mounting bracket 105a by snapping the motor head 111 of the motor drive unit 104 to the first mounting bracket 105a or coupling the motor head 111 to the first mounting bracket 105a using screws 115. The mounting brackets 105a and 105b can comprise similar configuration to the CSS-DECOR3 QMT®3 Series Décor Shade Hardware, available from Crestron Electronics, Inc. of Rockleigh, NJ Other types of brackets may be utilized without departing from the scope of the present embodiments.

In operation, the shade material 106 is rolled down and rolled up between an upper limit and a lower limit via the motor drive unit 104. Particularly, the motor 114 drives the drive wheel 117, which in turn engages and rotates the roller tube 102. The roller tube 102, in turn, engages and rotates the crown adapter wheel 116 with respect to the motor 114, while the motor housing 107, including the motor 114 and motor control module 112, remain stationary. As a result, the shade material 106 may be lowered from an upper limit where it is at an opened or rolled up position and substantially fully wrapped about the roller tube 102, to a lower limit where it is at a closed or rolled down position and substantially unraveled from the roller tube 102, and vice versa.

FIG. 2 is an illustrative block diagram 200 of the motor drive unit 104 according to one embodiment. The motor drive unit 104 may comprise the motor 114 and a motor control module 112. The motor control module 112 operates to control the motor 114, directing the operation of the motor, including its direction, speed, and position. The motor control module 112 may comprise fully integrated electronics printed on a printed circuit board (PCB). The motor control module 112 can comprise a controller 201, memory 203, capacitive touch sensor 205, communication interface 210, user interface 131, and light indicator 133. Power supply 202 can provide power to the circuitry of the motor control module 112 and in turn the motor 114. Power can be supplied to the motor control module 112 through a power cord 128 by connecting a terminal block 132 (FIG. 1) to a dedicated power supply 202, such as the CSA-PWS40 or CSA-PWS10S-HUBENET power supplies, available from Crestron Electronics, Inc. of Rockleigh, NJ In another embodiment, the motor drive unit 104 may be battery operated and as such may be connected to an internal or external power supply 202 in a form of batteries. In yet another embodiment, the motor drive unit 104 may be powered via solar panels placed in proximity to the window to aggregate solar energy.

Controller 201 can represent one or more processors, microprocessors, and the microprocessors can be "general purpose" microprocessors, a combination of general and special purpose microprocessors, or application specific integrated circuits (ASICs). Controller 201 can provide processing capability to provide processing for one or more of the techniques and functions described herein. Memory 203 can be communicably coupled to controller 201 and can store data and executable code. In another embodiment, memory 203 is integrated into the controller 201. Memory 203 can represent volatile memory such as random-access memory (RAM), but can also include nonvolatile memory, such as read-only memory (ROM) or Flash memory.

Motor control module 112 may further comprise a communication interface 210, such as a wired or a wireless communication interface, configured for receiving control commands from an external control point. The wireless interface may be configured for bidirectional wireless communication with other electronic devices over a wireless network. In various embodiments, the wireless interface 210 can comprise a radio frequency (RF) transceiver, an infrared (IR) transceiver, or other communication technologies known to those skilled in the art. In one embodiment, the wireless interface 210 communicates using the infiNET EX® protocol from Crestron Electronics, Inc. of Rockleigh, NJ infiNET EX® is a reliable and affordable protocol that employs steadfast two-way RF communications throughout a residential or commercial structure without the need for physical control wiring. infiNET EX® utilizes 16 channels on an embedded 2.4 GHz mesh network topology, allowing each infiNET EX® device to function as an expander, passing command signals through to every other infiNET EX® device within range (approximately 150 feet or 46 meters indoors), ensuring that every command reaches its intended destination without disruption. In another embodiment, communication is employed using the ZigBee® protocol from ZigBee Alliance. In yet another embodiment, wireless communication interface 210 may communicate via Bluetooth transmission. A wired communication interface 210 may be configured for bidirectional communication with other devices over a wired network. The wired interface 210 can represent, for example, an Ethernet or a Cresnet® port. Cresnet® provides a network wiring solution for Crestron® keypads, lighting controls, thermostats, and other devices. The Cresnet® bus offers wiring and configuration, carrying bidirectional communication and 24 VDC power to each device over a simple 4-conductor cable. In various aspects of the embodiments, the communication interface 210 and/or power supply 202 can comprise a Power over Ethernet (PoE) interface by which the controller 201 can receive both electric power signal and control input from a network. For example, the PoE interface may be connected through category 5 cable (CAT5) to a local area network (LAN) which contains both a power supply and multiple control points and signal generators. Additionally, through the PoE interface, the controller 201 may interface with the internet and receive control inputs remotely, such as from a homeowner running an application on a smart phone.

Motor control module 112 can further comprise a local user interface 131, such as a buttons disposed on the motor head 111 (FIG. 1), that allows users to set up the motor drive unit 104, for example to set the shade upper and lower limits. Furthermore, the motor control module 112 may comprise a light indicator 133, such as a multicolor light emitting diode (LED) disposed on the motor head 111 (FIG. 1), for indicating the motor status.

The control commands received by the controller 201 may be a direct user input to the controller 201 from the user interface 131, through a capacitive touch sensor 205 as further discussed below, or through a wired or wireless signal received by the communication interface 210 from an external control point. For example, the controller 201 may receive a control command from a wall-mounted button panel or a touch-panel in response to a button actuation or similar action by the user. Control commands may also originate from a signal generator such as a timer or external sensors, such as occupancy sensors. Accordingly, the motor control module 112 can integrate seamlessly with other control systems using the communication interface 210 to be operated from keypads, wireless remotes, touch screens, and wireless communication devices, such as smart phones. Additionally, the motor control module 112 can be integrated within a large scale building automation system or a small scale home automation system and be controllable by a central control processor, such as the PRO3 control processor available from Crestron Electronics, Inc., that networks, manages, and controls a building management system.

According to the aspects of the present embodiments, the roller shade 100 is activated by a user touching any exposed surface of the shade material 106. Referring to FIG. 3, there is shown an exemplary enlarged swatch of shade material 106. Shade material 106 may comprise at least one or a plurality of threads 300 comprising electrically conductive material. While shade material 106 is illustrated comprising warp and weft threads in plain weaving, shade material 106 may be made using other weaving techniques known in the art without departing from the scope of the present embodiments. Conductive threads 300 are connected to the capacitive touch sensor 205 via an electric path as further discussed below such that the capacitive touch sensor 205 may detect a user touching substantially any portion of the shade material 106. According to one embodiment, all warp and/or weft threads of shade material 106 may be made from conductive material. However, to reduce cost, shade material 106 may be constructed with only some warp or vertical threads made of conductive material. For example, as shown in FIG. 3, shade material 106 may comprise a plurality of intermittently weaved conductive warp threads 300, each extending vertically along the entire length of the shade material 106. While FIG. 3 illustrates every fourth warp thread 300 to be conductive, other intermittence variable may be chosen. Preferably, the shade material 106 comprises a plurality of conductive threads 300 disposed across substantially the entire width of the shade material 106. Additionally, the distance between any two conductive warp threads 300 should be sufficiently small to allow the capacitive touch sensor 205 to detect a user touching an area right in between such two conductive warp threads 300. This allows the roller shade 100 to be actuated by touching any point along the width of the shade material 106. Beneficially, the symmetrical configuration of shade material 106 shown in FIG. 3 allows the shade material 106 to be cut to any length in production to accommodate any window frame height, thereby simplifying the manufacturing process.

Referring to FIG. 4, there is shown a cross-sectional view of one such conductive thread 300. Conductive thread 300 may comprise a core 401 encased in an outer layer 402. According to one embodiment, core 401 may be made from a substantially conductive material, such as metal or metal alloys (e.g., copper, aluminum, tungsten, etc.). The outer layer 402 may comprise a material with low or substantially no conductance, including pure or blends of organic and synthetic materials (e.g., cotton, wool, wood, rubber, polymers, vinyl, PVC, etc.). Outer layer 402 may be a decorative layer made available in a variety of colors or may be made of material capable of being printed such that shade material 105 can be chosen from a plurality of colors, patterns, and designs. According to another embodiment, outer layer 402 may be infused with a substantially conductive material 403 to increase conductivity between inner core 401 and the outer surface of thread 300. For example, outer layer 402 may comprise a vinyl material infused with copper particles 403. According to yet another embodiment, thread 300 may comprise a substantially non-conductive core 401, such as fiberglass core, coated with conductive outer layer 402 or outer layer 402 infused with conductive particles 403. Additionally, thread 300 may comprise no core but may be made of a single pure or composite material capable of conducting electricity. According to an embodiment, shade material 106 may comprise a single type of conductive threads, or it may comprise variety of types and/or combinations of conductive threads. For example, shade material 106 may comprise all or some warp or vertical threads made with a substantially conductive core 401 (e.g., copper) and a substantially non-conductive outer layer 402 (e.g., vinyl) infused with a substantially conductive material 403 (e.g., copper particles); while the remainder of the threads, including the weft or horizontal threads, may be made of substantially non-conductive core 401 (fiberglass) and substantially non-conductive outer layer 402 (e.g., vinyl) infused with a substantially conductive material 403 (e.g., copper particles). In such a configuration, fewer copper core threads can be used to reduce cost.

Referring to FIG. 6, there is shown a cross-sectional view of roller shade 100 illustrating the conductive path between shade material 106 and capacitive touch sensor 205 located on the motor control module 112. Warp conductive threads 300 of shade material 106 extend between and are connected to the roller tube 102 at the upper end and hem bar 110 at the opposite bottom end. Particularly, the roller tube 201 may comprise an electrically conductive material, such as aluminum, containing at least one channel 103 (FIG. 1) longitudinally extending and recessed within its outer surface. Channel 103 is adapted to retain the upper terminal end of the shade material 106 therein via a longitudinal spline. This results in a contact, and thereby an electrically conductive path, between the conductive threads 300 of the shade material 106 and roller tube 102 across the entire width of the shade material 106. Notably, the conductive threads 300 do not need to terminate at the roller tube 201—the shade material 106 need only lay on the roller tube 102 to make the electrical contact. In terms of production, this allows the roller shade 100 to be assembled as any other roller shade, by cutting the shade material 106 to any required length and conventionally attaching the shade material 106 to the roller tube 102.

According to an embodiment, the hem bar 110 can also comprise an electrically conductive material, such as aluminum, steel, or other electrically conductive materials known to those skilled in the art. The hem bar 110 can comprise a channel (such as channel 103) for receiving the shade material 106, which can be retained therein via a longitudinal spline. As such, the user can touch any portion of the hem bar 110 to actuate the roller shade 100. According to another embodiment, the hem bar 110 may not necessarily comprise a conductive material (e.g., it may be made of plastic or wood), but it may be covered by the conductive shade material 106 such that the capacitive touch sensor 205 can detect a touch of the hem bar 110.

As discussed above, the crown adapter wheel 116 is located within and rotatably locked to the roller tube 102. The crown adapter wheel 116 is rotatably attached to the motor head 111 at a first end of the motor housing 107 via ball bearing 600 such that crown adapter wheel 116 and roller tube 102 rotate with respect to the motor housing 107. Ball bearing 600 may comprise an outer race 601, an inner race 602, and a plurality of balls 603 disposed therebetween. The ball bearing 600 may comprise an electrically conductive material, such as aluminum, stainless steel, or the like. The outer race 601 may be coupled to the crown adapter wheel 116 while the inner race 602 may be coupled to the motor head to allow axial rotation with respect to each other. The outer race 601 may be electrically coupled to the roller tube 102 either directly via friction fit or indirectly via an electrical contact 604, such as a conductive wire or plate. The inner race 602 may be electrically coupled to the motor control module 112, and thereby to the capacitive touch sensor 205 thereon, via electrical contact 606, such as a conductive wire. Since the outer race 601 and the inner race 602 make physical contact with the balls 603 therein, the ball bearing 600 creates an electrical path from the roller tube 102 to the capacitive touch sensor 205 so that the capacitive touch sensor 205 can sense touch of the shade material 106.

The capacitive touch sensor 205 is adapted to detect a user touching the shade material 106 via an electric path extending from the conductive threads 300 of the shade material 106 through the roller tube 102, conductive contact 604, ball bearing 600, conductive contact 606, and the capacitive touch sensor 205 on the motor control module 112. In one embodiment, the capacitive touch sensor 205 can comprise an RC oscillator that uses the body of the user touching the electrically conductive material of the shade material 106 as a capacitor. Referring to FIG. 2, the RC oscillator of the capacitive touch sensor 205 can comprise an internal capacitor 206 that generates an output signal that oscillates at an oscillation frequency and thereby charges and discharges the conductive threads 300 in the shade material 106. The shade material 106 by itself comprises a certain capacitance—referred to herein as the shade material capacitance ($C_{shade}$) 207. When a user 208 touches the shade material 106, the user's body acts as an additional capacitor—called body capacitance ($C_{body}$) 209—which is used by the RC oscillator of the capacitive touch sensor 205 to complete the circuit. As such, when a person touches the shade material 106, the overall capacitance of the RC oscillator (including the sensor capacitance ($C_{sensor}$) 206, shade material capacitance ($C_{shade}$) 207, and body capacitance ($C_{body}$) 209) is increased. This increased capacitance lowers the frequency of the RC oscillator. According to an embodiment, the user does not need to actually touch the conductive shade material 106, but only come within sufficient distance to the conductive shade material 106. According to one embodiment, the capacitive touch sensor 205 may sample the output signal of the RC oscillator to detect and report these changes in frequency to the controller 201. For example, the capacitive touch sensor 205 may comprise a frequency comparator that detects changes in frequency. According to another embodiment, the capacitive touch sensor 205 may measure the frequency of the output signal and report the detected output frequency values to the controller 201, which uses these values to determine changes in frequencies. The controller 201 may monitor these output frequency values and determine a baseline frequency. When a large enough difference in frequency is detected, i.e., the output frequency is decreased substantially below the baseline frequency, the controller 201 may register this change in frequency as a touch of the shade material 106 and decide how to operate the motor 114. According to a further embodiment, the controller 201 can decipher between a touch and proximity to window, shade parts, a person moving, or other objects, to prevent false triggers.

According to one embodiment, the controller 201 may cease oscillating the RC oscillator of the capacitive touch sensor 205 while the shade material 106 is moving such that the shade material 106 is not energized. In another embodiment, the shade material 106 may continue to be energized, but the controller 201 may ignore the feedback values of the RC oscillator. When the shade material 106 stops moving, the controller 201 may direct the capacitive touch sensor 205 to energize the shade material 106. The controller may then monitor the output signal of the RC oscillator and determine a baseline—which would normally be substantially constant when the shade material 106 is stationary. The controller 201 may register a touch when detecting a substantial change in the outputted frequency of the RC oscillator from the monitored baseline. According to another embodiment, the controller 201 may be configured to detect a touch of the shade material 106 as the shade material 106 is in the process of being raised or lowered. In such configuration, as the shade material 106 is moving, the output frequency of the RC oscillator will gradually change. The controller 201 may monitor this change in frequency and determine a baseline frequency change—for example by computing a slope. The controller 201 may register a touch of the shade material 106 when the outputted frequency substantially deviates from the monitored baseline frequency change. In other words, the controller 201 may look for abrupt changes in frequencies, discarding small changes.

The oscillation frequency at which the RC oscillator of the capacitive touch sensor 205 oscillates the shade material 106 may change based on various factors, including the width and height of the shade material 106, as well as the distance the shade material 106 hangs below the roller tube 102 as it rolls or unrolls. For example, when the shade material 106 is at the lower limit, the bottom of the shade material 106 will not get energized if the RC oscillator oscillates at higher frequencies. According to one embodiment, a set of a plurality of oscillation frequencies may be predetermined at the factory based on the size of the shade material 106 and stored to memory 203 of the roller shade 100. Each of these oscillation frequencies may be associated with a position of the shade material 106 between the upper and the lower limit. During operation, the controller 201 may keep track of the position of the shade material 106 between the upper and lower limit and based on this position pick an oscillation frequency from the stored set to be used by the capacitive touch sensor 205. As such, the controller 201 may decrease the oscillation frequency as the shade material 106 rolls down and increase the oscillation frequency as it rolls up.

According to another embodiment, instead of predetermining the oscillation frequency values, the controller 201 may continuously self-calibrate during operation of the roller shade 100 to update the oscillation frequency. According to yet another embodiment, the controller 201 may sweep through a plurality of predetermined output impedance values to determine a baseline frequency value for each output impedance value and register a touch when detecting a substantial change in the outputted frequency of the RC oscillator from the monitored baseline. The output impedance can be predetermined based on various factors of the shade material, including its length, width, and material. A large enough sweep of output impedance values can be compiled such that a touch can be detected over different sized shade material 106 and regardless of its position between the upper and lower limits.

According to an embodiment, the shade material 106 and/or the hem bar 110 can be printed with indicia identifying the raise and lower functions, for example as shown in FIG. 1, via a single touch 142 gesture, a double touch 143 gesture, and/or a swipe gesture 141. According to one embodiment, in a simple implementation, the controller 201 may be adapted to only detect a single touch gesture to lower or raise the shade material 106. For example, any single touch of the shade material 106 may cause the controller 201 to always raise the shade material 106. According to another embodiment, the controller 201 may track the position of the shade material 106 and decide how to operate the roller shade 100 when detecting a touch of the shade material 106. Memory 203 can store various objects identifying the operating command to be executed by the controller 201 based on the position of the shade material 106. An object can comprise a combination of a data structure and a procedure to manipulate the data. The various objects can be represented in a table.

For example, FIG. 7 illustrates exemplary objects in a form of a table 700 for use by a controller 201. Table 700 comprises Shade_position objects 701 and Operating_command objects 702. Upon determining that the shade material 106 has been touched, the controller 201 can detect the position of the shade material 106 and query table 700 to determine the operating command. For example, when the controller 201 detects a touch while the shade material 106 is at the lower limit, object 704 would indicate to raise the shade material 106. The shade material 106 rises until the controller 201 determines that it has reached the upper limit, at which time the controller 201 stops raising the shade material 106. If the controller 201 detects a touch of the shade material 106 while it is in the process of being raised, object 706 may also indicate to stop raising the shade material 106. As such, the controller 201 stops raising the shade material 106 either when it reaches the upper limit or if it is touched during the raise operation, whichever occurs first. After the shade material 106 stops and if it is partially drawn, a subsequent detected touch of the shade material 106 within a predetermined period of time T would trigger object 708 causing the controller 201 to lower the shade material 106. As such, the user may slightly adjust the height of the shade material 106 if it was raised too far.

Similarly, when the controller 201 detects a touch of the shade material 106 when it is at the upper limit, object 710 would indicate to lower the shade material 106. The shade material 106 lowers until the controller 201 determines that it has reached the lower limit. If the controller 201 detects a touch of the shade material 106 while it is in the process of being lowered, object 712 would indicate to stop lowering the shade material 106. As such, the controller 201 stops lowering the shade material 106 either when it reaches the lower limit or if it is touched during the lower operation, whichever occurs first. After the shade material 106 is stopped being lowered and if it is partially drawn, a subsequent detected touch of the shade material 106 received within a predetermined period of time T would trigger object 714 causing the controller 201 to raise the shade material 106. As such, the user may slightly adjust the height of the shade material 106 if it was lowered too far. Finally, if the controller 201 detects a touch outside of the predetermined period of time T and while the shade material 106 is in a partially drawn position, object 716 would indicate to the controller 201 to raise the shade material 106. The above operating process is merely exemplary and can vary without departing from the scope of the present embodiments.

According to yet another embodiment, the controller 201 can be adapted to decipher between various gestures and operate the motor 114 of the roller shade 100 based on the position of the shade material 106 and the detected gesture. In one embodiment, the controller 201 can decipher between a single touch gesture 142, a double touch gesture 143, and/or another number of touches. The controller 201 can register a double touch when the controller 201 detects two touches occurring within a predetermined amount of time. A single touch gesture 142 can be designated to lower the shade material 106, while a double touch gesture 143 can be designated to raise the shade material 106, or vice versa. In another embodiment, touching the conductive surface of the shade material 106 while it is in motion will cause the controller 102 to stop the operation of the motor 114. In yet another embodiment, the controller 201 can detect a hold and release gesture. The controller 201 can register a hold when it detects a substantial decrease in frequency of the RC oscillator over a predetermined period of time. The controller 201 can register a release when the frequency is subsequently substantially increased. Continuously holding or touching the shade material 106 or the hem bar 110 may cause the motor 114 to slowly lower the shade material 106 until the shade material 106 or the hem bar 1110 is released. Once the shade material 106 or the hem bar 110 is released, the shade material 106 will stop lowering. As such, a user can choose how low the shade material 106 should hang. In addition, the controller 201 can detect a tap-hold and release gesture. A tap-hold gesture may slowly raise the shade material 106 while the user is holding the shade material 106 until it is released. Once the shade material 106 or the hem bar 110 is released, the shade material 106 will stop rising.

FIG. 8 illustrates exemplary objects in a form of a table 800 for use by a controller 201. Table 800 comprises Gesture objects 801, Shade_position objects 802, and Operating_command objects 803. Upon detecting a gesture using the capacitive touch sensor 205, the controller 201 may determine the position of the shade material 106 and query table 800 to determine the operating command. For example, when the controller 201 detects a single touch gesture while the shade material 106 is stationary and not at the lower limit, objects 804 would indicate to lower the shade material 106. The shade material 106 lowers until the controller 201 determines that it has reached the lower limit. When the controller 201 detects a double touch gesture while the shade material 106 is stationary and not at the upper limit, objects 806 would indicate to raise the shade material 106. The shade material 106 is raised until the controller 201 determines it has reached the upper limit. When the controller 201 detects either a single touch or a double touch gesture while the shade material 106 is moving, objects 808 and 810 would indicate to the controller 201 to stop lowering or raising the shade material 106.

When the controller 201 detects a hold gesture while the shade material 106 is stationary but not at lower limit, objects 812 would indicate to slowly lower the shade material 106. In other words, the controller 201 lowers the shade material 106 at a predetermined speed slower than speed occurring in object 804 such that the user can comfortably maintain a hold of the shade material 106 (or the hem bar 110). The controller 201 would stop lowering the shade material 106 upon detecting that it reached the lower limit or upon detecting that the user released the shade material 106 (objects 814). When the controller 201 detects a tap-hold gesture when the shade material 106 is stationary but not at the upper limit, objects 816 would indicate to slowly raise the shade material 106. The controller 201 may stop raising the shade material 106 upon detecting that it has reached the upper limit or upon detecting that the shade material 106 has been released (objects 818). When the controller 201 detects either a hold or a tap-hold gesture while the shade material 106 is moving, objects 819 and 820 would indicate to stop lowering or raising the shade material 106.

According yet to another embodiment, the controller 201 may detect an up and down swiping gesture 141 such that when a user swipes up on the shade material 106 the controller 201 causes the shade material 106 to roll up, for example to the upper limit, and when a user swipes down on the shade material 106 the controller 201 causes the shade material 106 to roll down, for example to the lower limit. According to an embodiment, each of the conductive threads 300 may be made from a material having large resistance. For example, the conductive thread 300 may comprise a substantially non-conductive core 401 (such as fiberglass) and an outer layer 402 having a somewhat conductive additive material having large resistance. Referring to FIG. 5, a single vertical conductive thread 300 will comprise different resistance between its upper end (which is closer to sensor 205) and its lower end (which is farther from sensor 205)—this difference in resistance can be represented using a plurality of resistors 501*a-n*. Particularly, the upper end of the conductive thread 300 will comprise smaller resistance (e.g., 501*a* comprises 1 kilo Ω of resistance) and the lower end of the conductive thread 300 will comprise a larger resistance (e.g., 501*n* comprises 1 mega Ω of resistance). As such, depending on where the user touches the shade material 106 along the vertical path of the conductive thread 300, the energized output frequency of the shade material 106 will change. The capacitive touch sensor 205 may detect this change in output frequency and report it to the controller 201. The controller 201 may track the changes of the output frequency values and upon detecting a progressive growth of the output frequency values (that deviates from the baseline frequency), the controller 201 may determine that a user is swiping down on the shade material 106. Upon detecting a progressive decline in the output frequency values (that deviates from the baseline frequency), the controller 201 may determine that a user is swiping up on the shade material 106.

According to a further embodiment, the plurality of conductive threads 300 may be electrically connected to an array of capacitive touch sensors via a plurality of discrete landings such that horizontal gestures, as well as any combination of horizontal and vertical gestures, may be detected. It is also contemplated that the controller 201 can detect other types of gestures using the capacitive touch sensor 205 and the conductive touch material 106, enabling custom operations of the motor drive unit 104.

In addition, or alternatively, the aspects of the present embodiments can be used as a safety mechanism. As the shade material 106 lowers, the weighed hem bar 110 may hit a person causing injury. This is especially a concern in large shades with heavy hem bars. Additionally, the roller shade may hit an object, such as furniture, window sill, floor, or the like, causing damage to the object or to the roller shade itself. The controller 201 can detect that the hem bar 110 has hit or about to hit an obstacle using the capacitive touch sensor 205 during lowering of the shade material 106. The controller 201 can register a touch of an obstacle when the conductive surface of the shade material 106 and/or the hem bar 110 has been touched or brought close to an obstacle causing the controller 201 to detect a decrease in frequency of the RC oscillator below the detected baseline frequency. Memory 203 of the motor control module 112 can store one or more object identifying the operating commands to be executed by the controller 201 upon detecting a touch while the shade material 106 is in the process of being lowered. In one embodiment, in response the controller 201 may stop lowering the shade material 106. In another embodiment, the controller 201 may stop lowering the shade material 106 and then raises it by a predetermined distance. In yet another embodiment, upon detecting a hold gesture while the shade material 106 is in the process of being lowered, the controller 201 may stop lowering the shade material 106 and then raise it until the controller 201 no longer detects the obstacle in proximity to the shade material 106 and/or the hem bar 110—i.e., when the controller 201 detects a release of the hold. The controller 201 may stop raising the shade material 106 when it reaches a fully raised state, or when it determines that the shade material 106 and/or the hem bar 110 has been released, whoever occurs first. The controller 201 no longer detects the obstacle in proximity to the shade material 106 and/or the hem bar 110 when the frequency of the RC oscillator is subsequently increased above the detected baseline frequency.

INDUSTRIAL APPLICABILITY

To solve the aforementioned problems, the aspects of the embodiments are directed towards a touch actuated roller shade. The disclosed embodiments provide a system, software, and a method for a roller shade that can be actuated by touching the shade material. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

Alternate Embodiments

Alternate embodiments may be devised without departing from the spirit or the scope of the different aspects of the embodiments. In various embodiments, the motorized shade described herein may be used to cover a window, a door, a wall opening, or the like. In addition, the embodiments described herein may be adapted in varies types of window or door coverings, such as roller shades, inverted rollers, Roman shades, Austrian shades, pleated shades, blinds, shutters, skylight shades, garage doors, or the like.

What is claimed is:

1. A motorized shade for covering an architectural opening comprising:
    a shade material comprising and extending between an upper end and a lower end, wherein the shade material at least partially comprises electrically conductive material;
    a roller tube comprising an electrically conductive material, wherein the upper end of the shade material is attached to the roller tube, wherein the roller tube creates an electrically conductive path between the conductive material of the shade material and the roller tube;
    a capacitive touch sensor electrically connected to the roller tube via at least one electrical contact; and
    a controller electrically connected to the capacitive touch sensor and adapted to detect a touch of the shade material via the capacitive touch sensor and in response generate a command.

2. The motorized shade of claim 1, wherein the shade material comprises at least one thread comprising the electrically conductive material.

3. The motorized shade of claim 2, wherein the conductive thread comprises a core and an outer layer, wherein the core comprises the electrically conductive material.

4. The motorized shade of claim 3, wherein the outer layer comprises material with substantially no conductance.

5. The motorized shade of claim 3, wherein the outer layer is infused with electrically conductive material.

6. The motorized shade of claim 1, wherein the shade material comprises a plurality of warp threads comprising the electrically conductive material, wherein each of the plurality of conductive warp threads extends vertically along substantially the entire length of the shade material.

7. The motorized shade of claim 6, wherein the plurality of conductive warp threads are intermittently weaved in the shade material.

8. The motorized shade of claim 1, wherein the roller tube comprises a channel adapted to retain the upper end of the shade material therein.

9. The motorized shade of claim 1 further comprising a ball bearing having an outer race electrically connected to the roller tube, an inner race electrically connected to the capacitive touch sensor, and a plurality of balls disposed between the outer race and the inner race, wherein the ball bearing creates an electrically conductive path between the roller tube and the capacitive touch sensor.

10. The motorized shade of claim 1 further comprising a hem bar attached to the lower end of the shade material, wherein the hem bar comprises an electrically conductive material, wherein the controller is further adapted to detect a touch of the hem bar via the capacitive touch sensor.

11. The motorized shade of claim 1 further comprising a hem bar at the lower end of the shade material, wherein the lower end of the shade material is at least partially wrapped about the hem bar, wherein the controller is further adapted to detect a touch of the hem bar via the capacitive touch sensor.

12. The motorized shade of claim 1, wherein the capacitive touch sensor comprises an RC oscillator adapted to generate an output signal that oscillate at an oscillation frequency, wherein the output signal is used to charge and discharge the conductive shade material, wherein the controller is adapted to measure the output signal to detect output frequency values.

13. The motorized shade of claim 12, wherein the controller determines a touch of the shade material when detecting a change in the output frequency values.

14. The motorized shade of claim 12, wherein the controller determines a touch of the shade material when an output frequency value deviates from a monitored baseline frequency.

15. The motorized shade of claim 14, wherein the controller stores a set of a plurality of oscillation frequencies each associated with a position of the shade material between an upper limit and a lower limit.

16. The motorized shade of claim 14, wherein during operation, the controller is adapted to keep track of the position of the shade material, and based on the tracked position, pick an oscillation frequency to use by the capacitive touch sensor.

17. The motorized shade of claim 1, wherein the controller is adapted to detect at least one gesture comprising at least one selected from the group consisting of a single touch, a double touch, a swipe gesture, a hold and release gesture, and a tap-hold and release gesture.

18. The motorized shade of claim 1 further comprising a communication interface in communication with the controller and adapted for communication with at least one electronic device.

19. A motorized shade for covering an architectural opening comprising:
   a shade material comprising and extending between an upper end and a lower end, wherein the shade material comprises a plurality of warp threads each comprising an electrically conductive material;
   a roller tube comprising an electrically conductive material, wherein the upper end of the shade material is attached to the roller tube, wherein the roller tube creates an electrically conductive path between the conductive warp threads of the shade material and the roller tube;
   a capacitive touch sensor electrically connected to the roller tube via at least one electrical contact; and
   a controller electrically connected to the capacitive touch sensor and adapted to detect a touch of the shade material via the capacitive touch sensor.

20. A motorized roller shade for covering an architectural opening comprising:
   a shade material comprising and extending between an upper end and a lower end, wherein the shade material at least partially comprises electrically conductive material;
   a roller tube comprising an electrically conductive material, wherein the upper end of the shade material is attached to the roller tube, wherein the roller tube creates an electrically conductive path between the conductive material of the shade material and the roller tube;
   an RC oscillator electrically connected to the roller tube via at least one electrical contact and adapted to generate an output signal that oscillates at an oscillation frequency, wherein the output signal is used to charge and discharge the conductive material of the shade material; and
   a controller adapted to measure the output signal to detect output frequency values and in response to detect at least one gesture.

* * * * *